United States Patent
Kern

(10) Patent No.: US 9,473,161 B1
(45) Date of Patent: Oct. 18, 2016

(54) MIXED SIGNAL AUTOMATIC GAIN CONTROL FOR INCREASED RESOLUTION

(71) Applicant: Microchip Technology Incorporated, Chandler, AZ (US)

(72) Inventor: Lynn Kern, Tuscon, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 0 days.

(21) Appl. No.: 14/849,021

(22) Filed: Sep. 9, 2015

(51) Int. Cl.
  H03M 1/12 (2006.01)
  H03M 1/20 (2006.01)
  H03G 3/30 (2006.01)
  H03F 1/02 (2006.01)
  H03M 3/00 (2006.01)

(52) U.S. Cl.
  CPC ............ *H03M 1/20* (2013.01); *H03F 1/0205* (2013.01); *H03G 3/30* (2013.01); *H03M 1/12* (2013.01); *H03M 3/486* (2013.01)

(58) Field of Classification Search
  CPC ........ H03M 1/20; H03M 1/12; H03M 3/486; H03F 1/0205; H03G 3/30
  USPC ........................................ 341/131, 155, 120
  See application file for complete search history.

(56) References Cited

U.S. PATENT DOCUMENTS

| | | | | |
|---|---|---|---|---|
| 4,937,575 A * | 6/1990 | Kummer | ............. | H03M 1/1038 341/118 |
| 5,808,575 A * | 9/1998 | Himeno | ............. | H03M 1/0863 341/139 |
| 7,589,766 B2 * | 9/2009 | Itani | ........................ | H04N 5/243 348/229.1 |

* cited by examiner

*Primary Examiner* — Brian Young
(74) *Attorney, Agent, or Firm* — Slayden Grubert Beard PLLC

(57) ABSTRACT

A combination of a precision analog-to-digital converter (ADC), an analog amplifier having selectable gains and an intelligent controller to coordinate the amplifier gain selection and placement of the digital conversion results into at least one register provide for a very high resolution analog-to-digital conversion process, at a high sample rate and low power consumption. For example, a 14-bit ADC may be used with selectable gain analog amplification, e.g., ×1, ×2, ×4 and ×8, between the sampled signal and ADC input and an intelligent controller to provide a 17-bit conversion number having proper scaling of the digital sample words. The entire high resolution analog-to-digital conversion process may be automatically performed without additional control from external hardware/software.

18 Claims, 7 Drawing Sheets

MIXED SIGNAL AUTOMATIC GAIN CONTROL FOR INCREASED RESOLUTION

TECHNICAL FIELD

The present disclosure relates to high resolution analog-to-digital conversion, and, in particular, to providing automatic gain control to improve the resolution of an analog-to-digital converter.

BACKGROUND

Converting analog signals to digital representations of those analog signals at very high resolution requires a very high order (number of bits) analog-to-digital converter (ADC). High resolution ADCs are expensive and/or slow, and may consume a lot of power during an analog-to-digital conversion process.

SUMMARY

Therefore a need exists to measure an analog signal, e.g., voltage or current, signals at very high resolution and over a very wide range of signal amplitude values by using inexpensive high resolution analog-to-digital conversion at a fast conversion rate, and doing so with low power consumption.

According to an embodiment, an apparatus for analog-to-digital conversion at high resolution may comprise: a selectable gain amplifier having an input for an analog signal; an analog-to-digital converter (ADC) coupled to the selectable gain amplifier and adapted to receive an analog output therefrom and convert samples of the analog output into digital representations thereof; a controller coupled to the ADC and the selectable gain amplifier, wherein the controller selects gains of the amplifier based upon the digital representations, and shifts bit positions of the digital representations based upon the selected gains.

According to a further embodiment, the selectable gain amplifier may have a plurality of selectable gains. According to a further embodiment, the plurality of selectable gains may comprise gains of one (1), two (2), four (4) and eight (8). According to a further embodiment, the digital representation may be shifted three bits toward the most significant bit when the gain selected may be one (1), shifted two bits toward the most significant bit when the gain selected may be two (2), shifted one bit toward the most significant bit when the gain selected may be four (4), and not shifted when the gain selected may be eight (8). According to a further embodiment, a plurality of bit position shifted digital representations may be stored in registers comprising the number of bits of the digital representation plus the number of bits corresponding to the gain selections of the amplifier.

According to a further embodiment, a gain may be selected for a next sample based upon: a slope determined by subtracting a digital representation of a previous sample amplitude from a digital representation of a current sample amplitude, and a relationship of the digital representation of the current sample amplitude compared to a plurality of amplitude thresholds, wherein for a positive slope and the digital representation may be greater than at least one of the plurality of the amplitude thresholds the gain may be decreased, and for a negative slope and the digital representation may be less than at least one other of the plurality of the amplitude thresholds the gain may be increased.

According to a further embodiment, the at least one and the at least one other of the plurality of the amplitude thresholds may be the same. According to a further embodiment, the at least one and the at least one other of the plurality of the amplitude thresholds may be different. According to a further embodiment, the digital representation of the previous sample may be a plurality of digital representations of previous samples averaged together. According to a further embodiment, the digital representation of the current sample may be a plurality of digital representations of current samples averaged together. According to a further embodiment, the selectable gain amplifier may be a programmable gain amplifier (PGA). According to a further embodiment, the selectable gain amplifier may be an amplifier having at least on switchable input attenuator. According to a further embodiment, the selectable gain amplifier, ADC and digital controller may be provided in a mixed signal integrated circuit. According to a further embodiment, the mixed signal integrated circuit may be a microcontroller.

According to another embodiment, a method for analog-to-digital conversion at high resolution may comprise the steps of: amplifying an analog signal with a selectable gain amplifier; converting samples of an analog output of the selectable gain amplifier into digital representations thereof with an analog-to-digital converter (ADC) coupled to the selectable gain amplifier; selecting gains of the amplifier based upon the digital representations with a controller coupled to the ADC and the selectable gain amplifier; and shifting bit positions of the digital representations based upon the selected gains.

According to a further embodiment of the method may comprise the step of storing the digital representations in a memory. According to a further embodiment of the method, the memory may be a plurality of storage registers. According to a further embodiment of the method, the storage registers may comprise the number of bits of the digital representations plus the number of bits of the shifted bit positions.

According to a further embodiment of the method may comprise the steps of: subtracting a digital representation of a previous sample from a digital representation of a current sample to determine a slope, wherein if a subtraction difference may be positive then the slope may be positive, and if the subtraction difference may be negative then the slope may be negative; comparing the digital representation of the current sample to a plurality of amplitude thresholds; decreasing the gain for a positive slope when the digital representation may be greater than at least one of the plurality of the amplitude thresholds, and increasing the gain for a negative slope when the digital representation may be less than at least one other of the plurality of the amplitude thresholds. According to a further embodiment of the method may comprise the step of averaging a plurality of digital representations for selecting the gains of the amplifier.

According to a further embodiment of the method may comprise the steps of: subtracting an average of a plurality of digital representations of previous samples from a digital representation of an average of a plurality of current samples to determine a slope, wherein if a subtraction difference may be positive then the slope may be positive, and if the subtraction difference may be negative then the slope may be negative; comparing the average of the plurality of digital representations of the current samples to a plurality of amplitude thresholds; decreasing the gain for a positive slope when the average of the plurality of digital representations may be greater than at least one of the plurality of the amplitude thresholds, and increasing the gain for a negative slope when the average of the plurality of digital representations may be less than at least one other of the plurality of the amplitude thresholds.

According to yet another embodiment, a microcontroller providing analog-to-digital conversion at high resolution may comprise the steps of: amplifying an analog signal with a selectable gain amplifier; converting samples of an analog output of the selectable gain amplifier into digital representations thereof with an analog-to-digital converter (ADC) coupled to the selectable gain amplifier; selecting gains of the amplifier based upon the digital representations with a controller coupled to the ADC and the selectable gain amplifier; and shifting bit positions of the digital representations based upon the selected gains.

BRIEF DESCRIPTION OF THE DRAWINGS

A more complete understanding of the present disclosure may be acquired by referring to the following description taken in conjunction with the accompanying drawings wherein.

Figure 1:
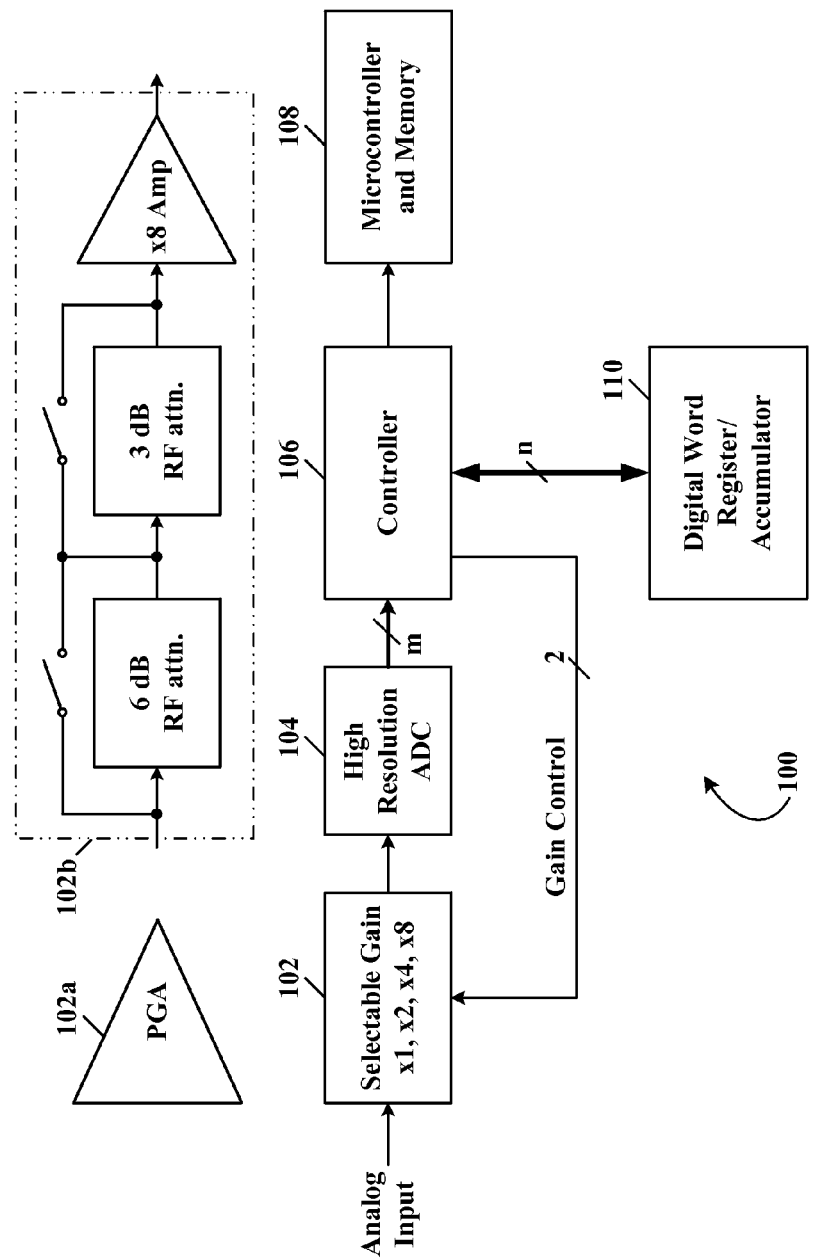
FIG. 1 illustrates a schematic block diagram of a mixed signal automatic gain control system, according to specific example embodiments of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

DETAILED DESCRIPTION

According to various embodiments of this disclosure, an analog signal, e.g., voltage or current, may be measured over a very wide range of values. For example, a current measurement range of from about one milliampere to about 10 amperes is desired with a sample conversion rate of about five kilohertz. These resolution and conversion speed requirements may be used for example, but are not limited to, measuring micro joules over time in determining energy used over a sample period. According to specific example embodiments of this disclosure, a combination of a 14-bit ADC, an analog amplifier having selectable gains and an intelligent controller to coordinate the amplifier gain selection and placement of the digital conversion results into at least one digital register provide for a very high resolution analog-to-digital conversion process, at a high sample rate and low power consumption. A 14-bit ADC may be used with selectable gain analog amplification, e.g., ×1, ×2, ×4 and ×8, between the sampled signal and ADC input and an intelligent controller to provide a 17-bit conversion number having proper scaling of the digital sample words.

The entire high resolution analog-to-digital conversion process may be automatically performed without additional control from external hardware/software. It is contemplated and within the scope of this disclosure that higher or lower resolution conversion results may be obtained using a higher or lower bit resolution ADC and/or using analog amplification having more or less number of selectable gains, according to embodiments of this disclosure. One having ordinary skill in the art of analog and digital electronics, and having the benefit of the teachings of this disclosure, could design and build such circuits.

In one embodiment a programmable gain amplifier (PGA) may be used for the selectable gain analog amplification. In another embodiment a fixed gain amplifier having switchable front end attenuators may be used for the selectable gain analog amplification.

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a schematic block diagram of a mixed signal automatic gain control system, according to specific example embodiments of this disclosure. A mixed signal automatic gain control system, generally represented by the numeral 100, may comprise an analog signal amplifier 102 having selectable gains, a high resolution analog-to-digital converter (ADC) 104, and a controller 106. The mixed signal automatic gain control system 100 may further comprise a digital word register/accumulator 110 and/or a microcontroller and memory 108. Alternatively, the analog signal amplifier 102, ADC 104, controller 106 and register 110 may be a peripheral of a microcontroller device. There may be many different ways to implement the gain selectable analog signal amplifier 102, two of which are shown as a programmable gain amplifier 102a, and RF attenuators and switches in front of an amplifier having a gain of eight.

For example, but not as a limitation, the signal amplifier 102 may have four selectable precision gains, e.g., gains of one, two, four and eight. Fewer and greater number of selectable gains are contemplated herein. Preferably the gains will be in binary increments of $2^p$, where p is an integer number starting at zero (0). The signal amplifier 102 may have each one of its selectable gains calibrated to a desired accuracy.

The high resolution ADC 104 may be coupled with an analog sample and hold circuit at its input (not shown), and may also be coupled to an analog multiplexer that may be coupled to a plurality of sample and hold circuits to provide for more than one analog input (with a corresponding plurality of gain selectable amplifiers). In the alternative, a multiplexer and a plurality of sample and hold circuits may be provided ahead of the gain selectable amplifier 102 for receiving and storing a plurality of analog inputs (not shown).

An analog input is converted into a digital representation thereof by the ADC 104. Based on that digital representation of the analog input and at least one digital representation of a preceding in time analog input a rising (positive) slope or a falling (negative) slope may be determined and from the digital representation value a determination may be made on whether to increase or decrease the gain of the analog amplifier 102 for the next analog input sample taken. This is done so as to maximize the digital conversion resolution of the sampled analog signal with the ADC 104. The resulting conversion digital word bit from the ADC 104 may be aligned in a digital word register/accumulator 110 based upon the amplifier 102 gain selected for that particular analog input signal sample taken, as more fully described hereinafter. The ADC 104 has a m-bit output, e.g., 14 bits, and the controller 106 will bit shift the m-bit output from the ADC 104 into an n-bit, e.g., 17 bits, (n>m) digital word based upon the gain selected for the analog amplifier 102. Thus, the position of the m-bit word within the n-bit register varies depending on the selected gain.

Figure 2:
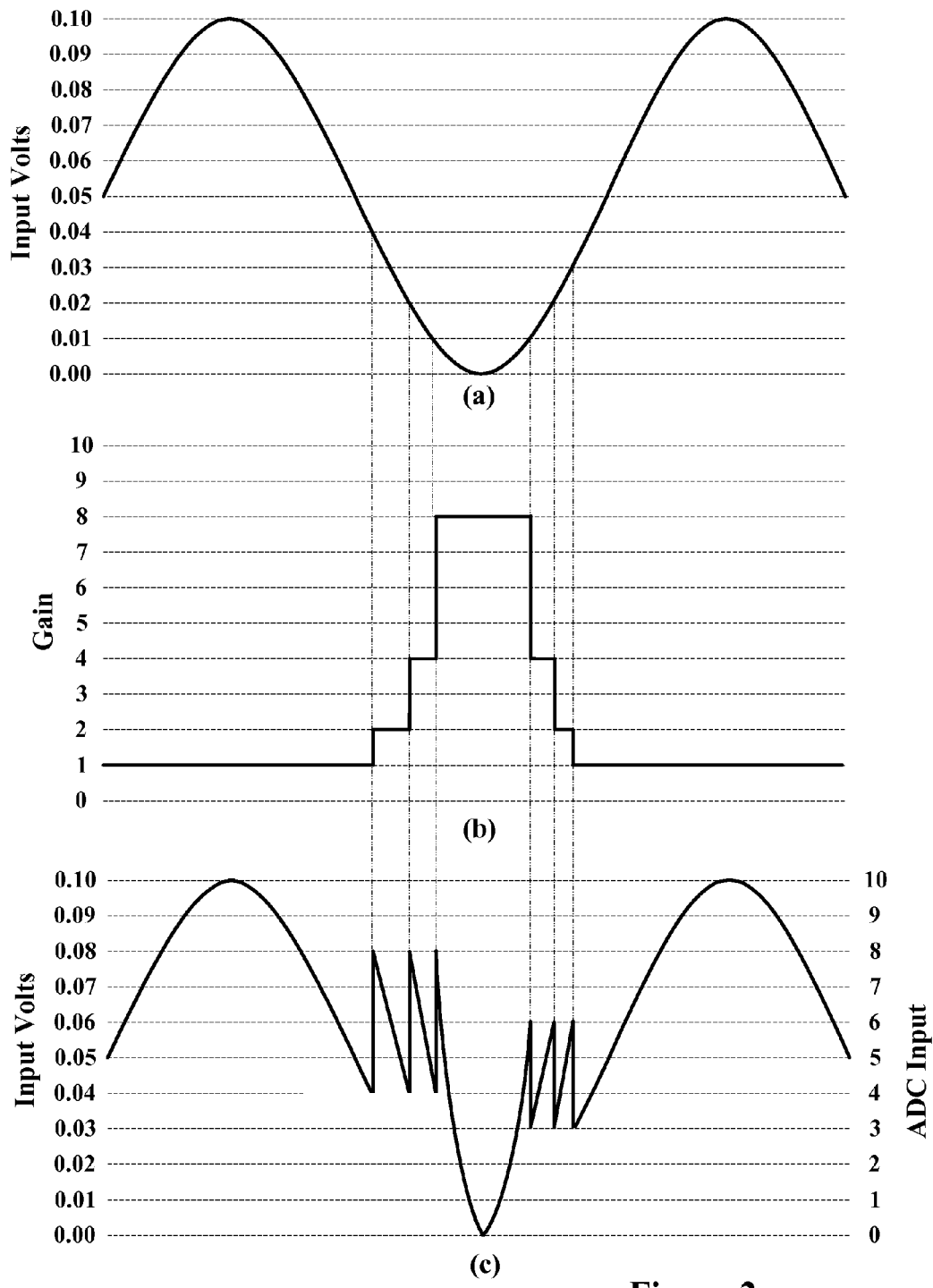
FIG. 2 illustrates schematic graphs of an analog signal, amplifier gain selection and a resulting gain adjusted analog signal to an ADC input, according to specific example embodiments of this disclosure.

Referring to FIG. 2, depicted are schematic graphs of an analog signal, amplifier gain selection and a resulting gain adjusted analog signal to an ADC input, according to specific example embodiments of this disclosure. FIG. 2 graphically shows the actions of the selectable gain amplifier 102 and the input signal at the input of the ADC 104. In the following example the slope is assumed negative and the threshold is set to 80 percent. When the analog input signal is greater than or equal to 0.04 volts the amplifier 102 may be set to have a gain of one, resulting in the ADC 104 having a full scale reading (FSR) of 100 millivolts (mV). When the analog input signal is less than 0.04 volts but greater than 0.02 volts the amplifier 102 may be set to have a gain of two resulting in the ADC 104 having a FSR of 50 mV. When the analog input signal is less than 0.02 volts but greater than 0.01 volt the amplifier 102 may be set to have a gain of four resulting in the ADC 104 having a FSR of 25 mV. And when the analog input signal is less than 0.01 volt (10 millivolts) the amplifier 102 may be set to have a gain of eight resulting in the ADC 104 having a FSR of 12.5 mV. Other analog input signal levels based upon signal slope (increasing or decreasing) may also affect the determination of the analog amplifier gain selection.

In the graphical examples shown in FIG. 2 a negative slope gain threshold of 80 percent is assumed; or 40 mV, 20 mV and 10 mV for 50 mV, 25 mV and 12.5 mV FSR, respectively. The positive slope gain change threshold for the example graphs of FIG. 2 was set to 60 percent, or 7.5 mV, 15 mV, and 30 mV for 12.5 mV, 25 mV, and 50 mV FSR, respectively. This is only an example, the thresholds may be set based on a specific application. The thresholds chosen for demonstrative purposes are set for a rapidly changing increase in power, and a more gradual decrease. The slower the change in power, either positive or negative, the closer the thresholds can be set to the theoretical FSR of the ADC.

Generally, in power measurements the power is going one way as determined by the application, e.g., consumers of power not suppliers. Therefore positive measurement values will be the case. For bi-directional applications where there are both positive and negative measurement values then a voltage comparator may be used to switch signal polarity to the ADC, thus simplifying the math operations by not requiring 2's complement calculations.

Figure 2A:
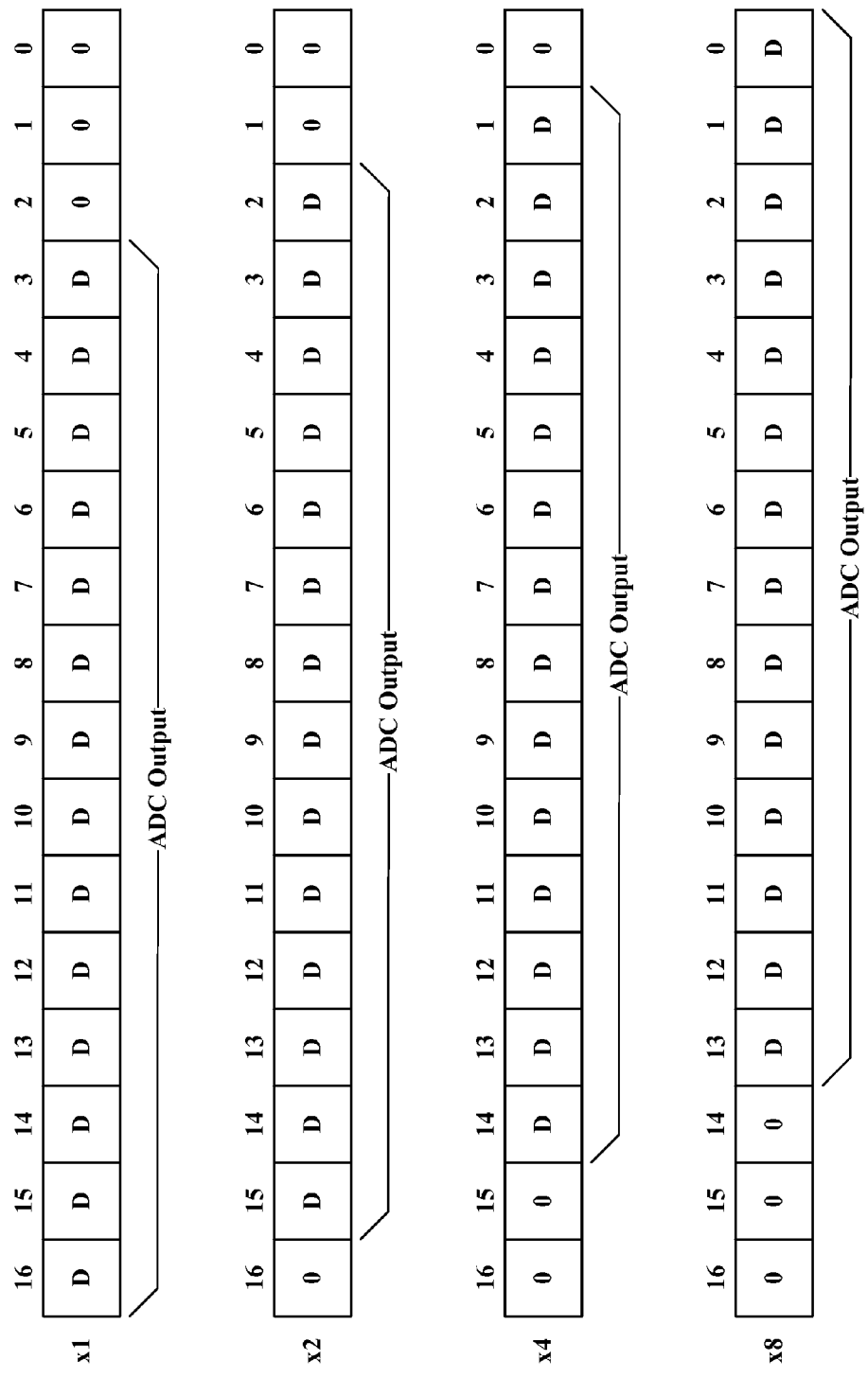
FIG. 2A illustrates schematic diagrams of a 17 bit accumulator register at various amplifier gain settings, according to specific example embodiments of this disclosure.

Referring to FIG. 2A, depicted are schematic diagrams of a 17 bit digital accumulator register at various amplifier gain settings, according to specific example embodiments of this disclosure. For example, the digital word register/accumulator 110 may comprise 17 data bits and the high resolution ADC 104 has a digital output of 14 data bits. It is contemplated and within the scope of this disclosure that the digital word register/accumulator 110 may comprise more or less than 17 data bits, and the ADC 104 may have a digital output of more or less than 14 data bits.

When using a 14 bit ADC 104 with the gain of the amplifier 102 set to one (×1) (e.g., FSR=100 mV) the output of the ADC 104 would be stored in bits <16:3> and zeros forced into bits <2:0> of the register/accumulator 110. With a gain of two (×2) (e.g., FSR=50 mV) the output of the ADC 104 would be stored in bits <15:2> with zeros forced into bits <16, 1, 0>. With a gain of four (×4) (e.g., FSR=25 mV) the output of the ADC 104 would be stored in bits <14:1> with zeros forced into bits <16, 15, 0>. With a gain of eight (×8) (e.g., FSR=12.5 mV) the output of the ADC 104 would be stored in bits <13:0> with zeros forced into bits <16:14>. When the digital word register/accumulator 110 is used to accumulate (add and store) a plurality of digital words, wherein the values of these digital words would always be properly aligned. The microcontroller and memory 108 may be used with or in place of the digital word register/accumulator 110 and/or controller 106

Figure 3:
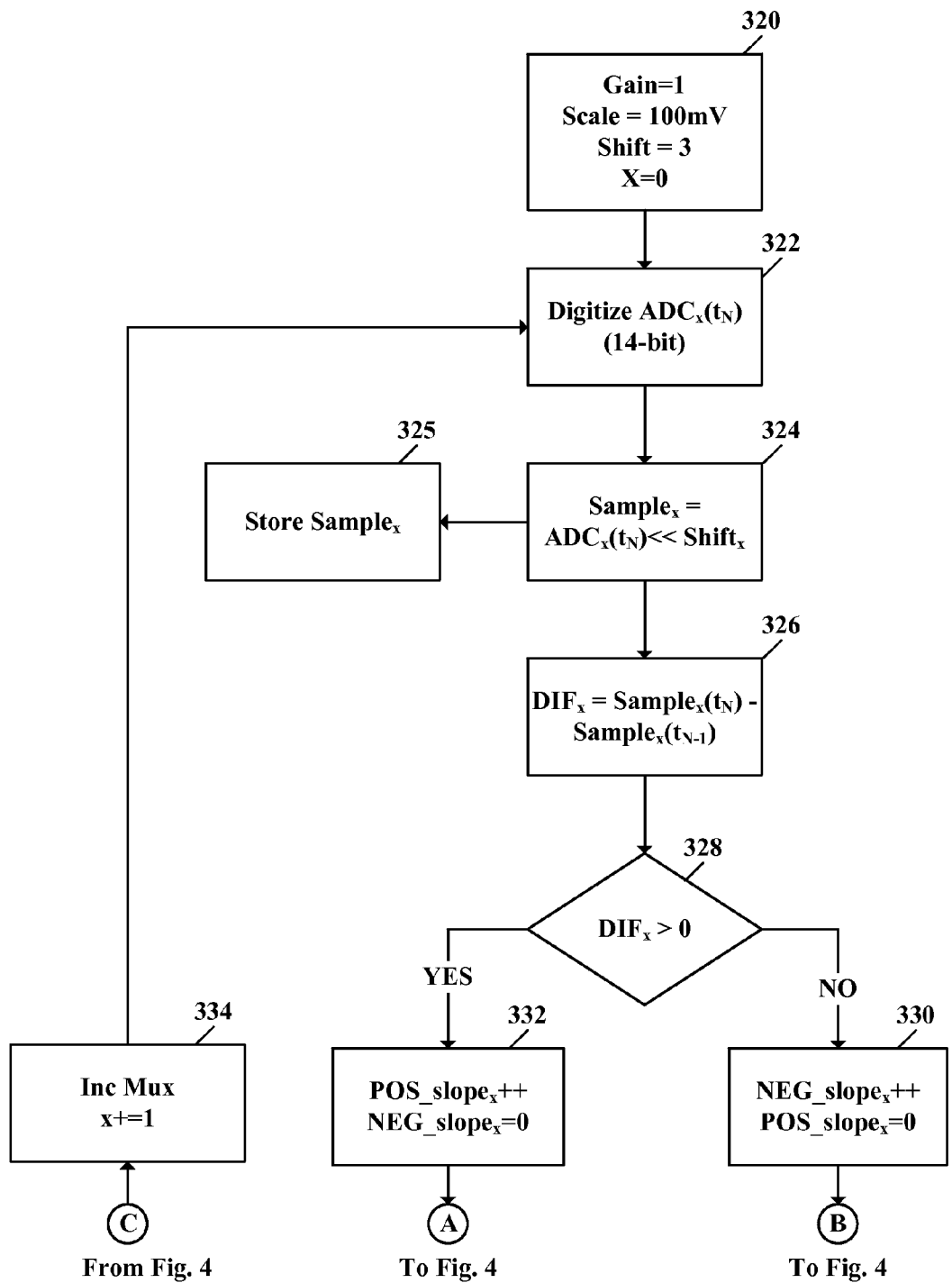
FIGS. 3 and 4 illustrates a schematic flow diagram representing operation of the mixed signal automatic gain control system shown in FIG. 1, according to specific example embodiments of this disclosure.
Figure 4:
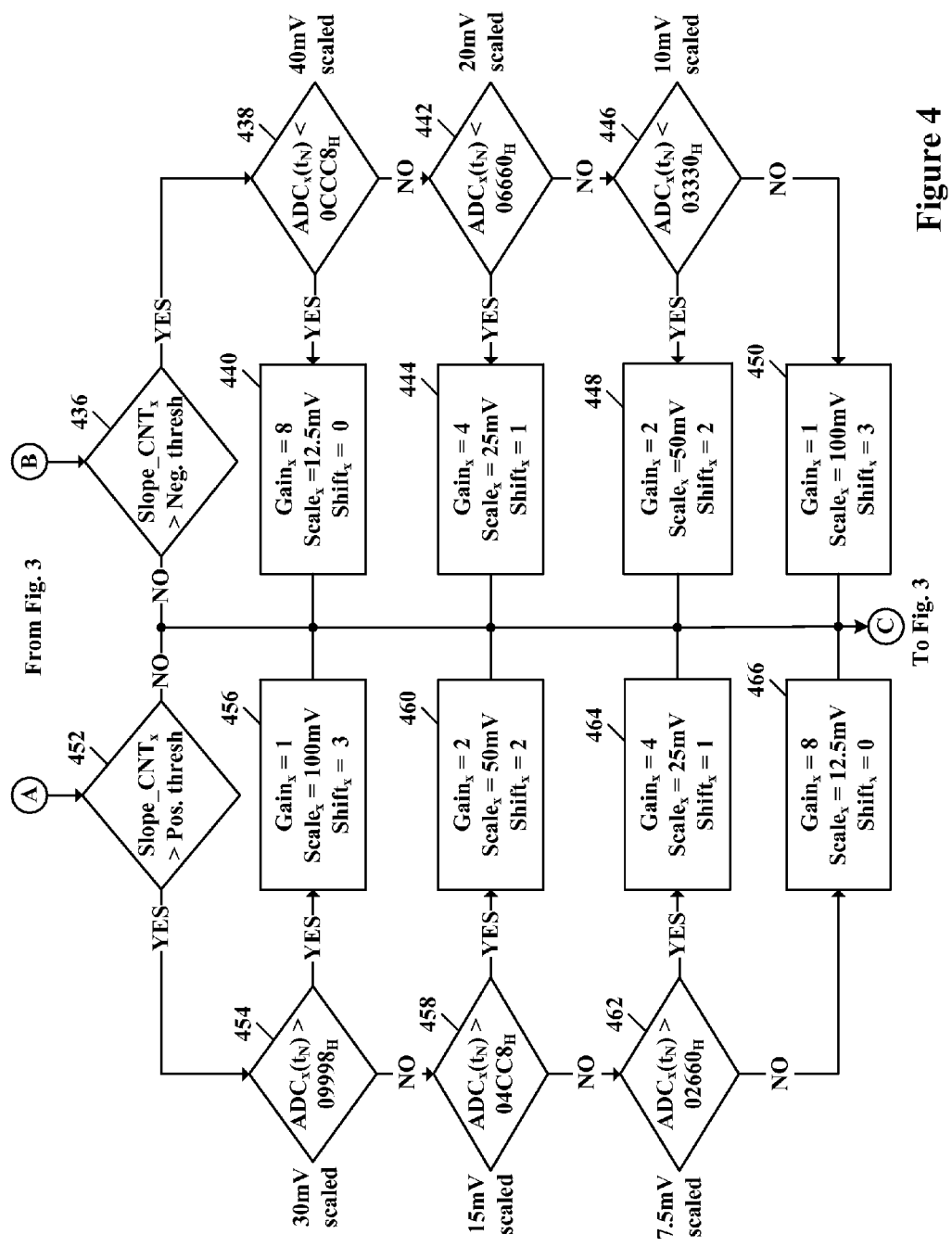

Referring to FIGS. 3 and 4, depicted is a schematic flow diagram representing operation of the mixed signal automatic gain control system shown in FIG. 1, according to specific example embodiments of this disclosure. Operation of the mixed signal automatic gain control system 100 may be described as follows: In step 320 the amplifier gain is set to 1, providing a FSR (full scale reading) of 100 mV. In step 322 the amplified analog input signal, initially from step 320 to be set at a gain of one (1) thereafter at a gain selected from the steps described hereinafter, is sampled and digitized in the ADC 104 to, for example but not limited to, 14 bits resolution. In step 324 the 14 bit digitized output of the ADC 104 is shifted according to the gain selected from previous samples and becomes a "current sample." In step 325 the current sample is stored in a memory. In step 326 a "previous sample," taken and stored before the current sample, is subtracted from the current sample to provide a difference value. Step 328 determines whether the difference value is positive or not, e.g., zero or negative. When the difference value is positive that indicates that the current sample has a greater amplitude than the previous sample. When the difference value is zero or negative that indicates that the current sample amplitude is the same or less than the previous sample amplitude, respectively. "Zeroing out" of the opposite value of the difference changes is to eliminate needless oscillation between two gain settings.

When the slope of the difference value is positive, step 332 will add 1 to a positive slope counter. When the slope of the difference value is not positive (zero or negative), step 330 will add 1 to a negative slope counter. In step 452 an accumulated number of positive slopes occurring within a certain time period is compared with a positive slope occurrence threshold number. If the accumulated number of positive slopes is greater than the positive slope occurrence threshold number then steps 454, 458 and 462 may determine if a gain change is required for the analog amplifier. The certain time period is measured in sample periods, e.g., 256 or less. The longer the period, the lower the cutoff on the effective low pass filter. The certain time period may be set according to the application and environment it is operating under.

In step 436 an accumulated number of negative slopes occurring within a certain time period, as described more fully above, is compared with a negative slope occurrence threshold number. If the accumulated number of negative slopes is greater than the negative slope occurrence threshold number then steps 438, 442 and 446 may determine if a gain change is required for the analog amplifier. The positive and negative slope occurrence thresholds may be the same number value or different number values, and may be changed and stored in programmable registers (not shown) for "tuning" the operation of the mixed signal automatic gain control system 100.

If the number of positive slopes occurring is not greater than the positive slope occurrence threshold in step 452 within a certain time period then in step 334 an analog input multiplexer may be incremented and a next analog channel may then be sampled and converted to a digital representation in step 322. Likewise, if the number of negative slopes occurring is not greater than the negative slope occurrence threshold in step 436 within a certain time period then in step 334 an analog input multiplexer may be incremented and a next analog channel may then be sampled and converted to a digital representation. The certain time periods associated respectively with the positive and negative number of slope occurrences may be the same time period or different time periods, e.g., one time period for the positive slope occurrences and another time period for the negative slope occurrences. This effectively implements a "digital low pass filter" for slope direction determination. The slope occurrence threshold values and/or threshold time periods may also change depending upon the setting of the analog amplifier gain during those slope occurrences.

For all of the above digital value slope and amplitude determinations the full 17 bit word from the digital word register/accumulator 110 may be used. It is contemplated and within the scope of this disclosure that a plurality of digital values may be averaged before determining whether the analog signal has a rising amplitude (positive slope) or a decreasing amplitude (negative slope). This averaging of digital values may be performed before step 326. The POS_Slope$_x$ and NEG_slope$_x$ eliminate small oscillations, and the sample period threshold makes the low pass function wait long enough to an effective filter.

If step 452 determines that the positive slope occurrence is greater than the positive slope occurrence threshold, then step 454 determines if the present sample amplitude value is greater than a first amplitude threshold, for example but not limited to, 30 mV scaled, e.g., 09998$_H$, and of so then in step 456 the analog amplifier gain is set to 1, the digital output of the ADC 104 is shifted 3 bits to the left (toward MSB) and then returns to step 334 wherein the multiplexer is incremented by 1 to the next analog input channel.

If step 454 determines that the present sample amplitude value is not greater than the first amplitude threshold, then step 458 determines whether the present sample amplitude value is greater than a second amplitude threshold, for example but not limited to, 15 mV scaled, e.g., 04CC8$_H$, and of so then in step 460 the analog amplifier gain is set to 2, the digital output of the ADC 104 is shifted 2 bits to the left (toward MSB) and then returns to step 334 wherein the multiplexer is incremented by 1 to the next analog input channel.

If step 458 determines that the present sample amplitude value is not greater than the second amplitude threshold, then step 462 determines whether the present sample amplitude value is greater than a third amplitude threshold, for example but not limited to, 7.5 mV scaled, e.g., 02660$_H$, and of so then in step 464 the analog amplifier gain is set to 4, the digital output of the ADC 104 is shifted 1 bit to the left (toward MSB) and then returns to step 334 wherein the multiplexer is incremented by 1 to the next analog input channel.

If step 462 determines that the present sample amplitude value is not greater than the third amplitude threshold, then in step 466 the analog amplifier gain is set to 8, the digital output of the ADC 104 is not shifted and then returns to step 334 wherein the multiplexer is incremented by 1 to the next analog input channel.

If step 436 determines that the negative slope occurrence is greater than the negative slope occurrence threshold, then step 438 determines if the present sample amplitude value is less than a fourth amplitude threshold, for example but not limited to, 40 mV scaled, e.g., 03330$_H$, and of so then in step 440 the analog amplifier gain is set to 8, the digital output of the ADC 104 is not shifted and then returns to step 334 wherein the multiplexer is incremented by 1 to the next analog input channel.

If step 438 determines that the present sample amplitude value is not less than the fourth amplitude threshold, then step 442 determines whether the present sample amplitude value is less than a fifth amplitude threshold, for example but not limited to, 20 mV scaled, e.g., 06660$_H$, and of so then in step 444 the analog amplifier gain is set to 4, the digital output of the ADC 104 is shifted 1 bit to the left (toward MSB) and then returns to step 334 wherein the multiplexer is incremented by 1 to the next analog input channel.

If step 442 determines that the present sample amplitude value is not less than the fifth amplitude threshold, then step 446 determines whether the present sample amplitude value is less than a sixth amplitude threshold, for example but not limited to, 10 mV scaled, e.g., 0CCC8$_H$, and of so then in step 446 the analog amplifier gain is set to 2, the digital output of the ADC 104 is shifted 2 bits to the left (toward MSB) and then returns to step 334 wherein the multiplexer is incremented by 1 to the next analog input channel.

If step 446 determines that the present sample amplitude value is not less than the sixth amplitude threshold, then in step 450 the analog amplifier gain is set to 1, the digital output of the ADC 104 is shifted 3 bits to the left (toward MSB) and then returns to step 334 wherein the multiplexer is incremented by 1 to the next analog input channel.

When the last analog input channel is selected the next multiplexer increment will be back to the first analog input channel. A change of analog amplifier gain may also be determined if the difference between a previous sample amplitude and a present sample amplitude (or averages thereof) is greater than a amplitude change threshold (not shown in flow diagram FIGS. 3 and 4). These amplitude thresholds may be changed and stored in programmable registers (not shown) for "tuning" the operation of the mixed signal automatic gain control system 100.

Figure 5:
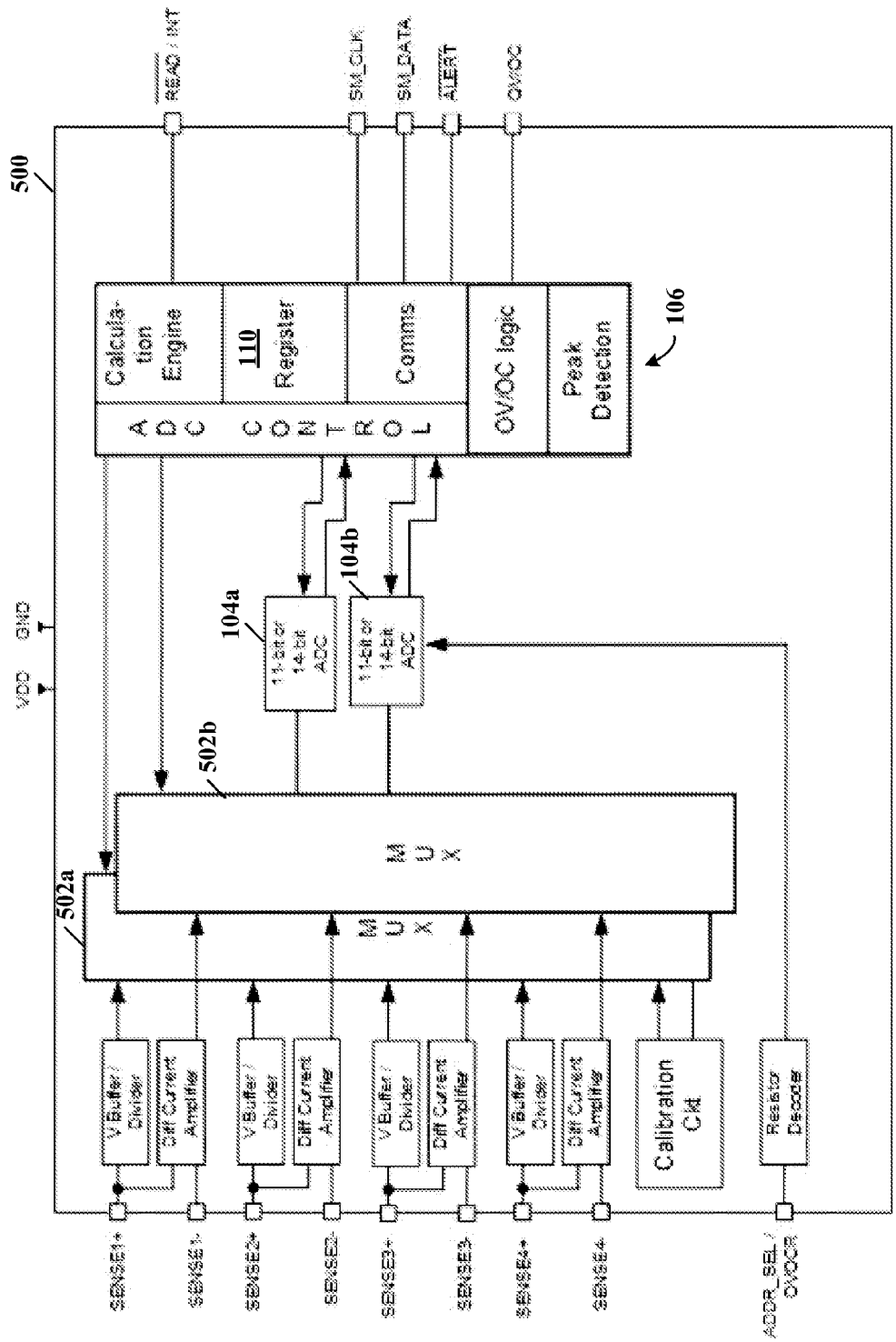
FIG. 5 illustrates a schematic block diagram of a multiple analog input and conversion mixed signal automatic gain control integrated circuit, according to specific example embodiments of this disclosure.

Referring to FIG. 5, depicted is a schematic block diagram of a multiple analog input and conversion mixed signal automatic gain control integrated circuit, according to specific example embodiments of this disclosure. The integrated circuit 500 may comprise a plurality of analog differential inputs (four shown), dual multiplexers 502, one for the plus (+) input and the other for the minus (−) input for each of the plurality of analog differential inputs. Dual ADCs 104a and 104b may be provided for converting an analog differential signal to digital representations thereof. ADC control may be provided by a digital engine (controller 106) that may also provide the register/accumulator 110, a calculation engine, peak detection, and communications interface (e.g., for communicating gain selection to the selectable gain amplifier 102 (FIG. 1). In addition, over voltage (OV) and over current (OC) logic, calibration for the analog channels, and other inputs and outputs as necessary for the intended application. A microcontroller and memory 108 may be provided with a separate integrated circuit or may be part of this same integrate circuit 500. The digital engine (controller 106) may operate independently at low power for extended battery operation and/or to reduce the computational load from the microcontroller and memory 108 doing other functions.

Figure 6:
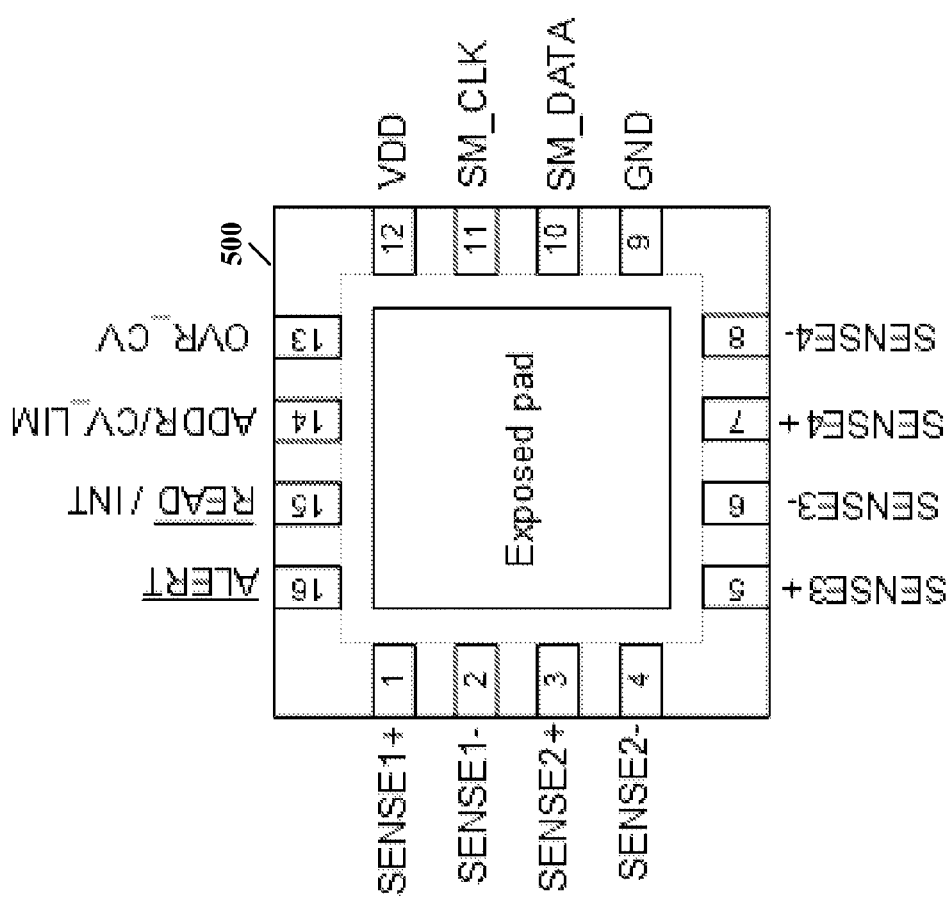
FIG. 6 illustrates a schematic top view of a semiconductor die for the integrated circuit shown in FIG. 5, according to specific example embodiments of this disclosure.

Referring to FIG. 6, depicted is a schematic top view of a semiconductor die for the integrated circuit shown in FIG. 5, according to specific example embodiments of this disclosure. The small outline package integrated circuit may be used for the circuits shown in FIG. 5. Connections for four differential analog inputs are provided along with various other control and power connections. More or fewer number of analog inputs, either differential and/or single ended are contemplated herein.

The invention claimed is:

1. An apparatus for analog-to-digital conversion at high resolution, comprising:
    a selectable gain amplifier having an input for an analog signal;
    an analog-to-digital converter (ADC) coupled to the selectable gain amplifier and adapted to receive an analog output therefrom and convert samples of the analog output into digital representations thereof;
    a controller coupled to the ADC and the selectable gain amplifier, wherein
    the controller selects gains of the amplifier based upon the digital representations, and
    shifts bit positions of the digital representations based upon the selected gains, wherein:
        the selectable gain amplifier has a plurality of selectable gains;
        the plurality of selectable gains comprise gains of one (1), two (2), four (4) and eight (8); and
        wherein the digital representation is shifted three bits toward the most significant bit when the gain selected is one (1), shifted two bits toward the most significant bit when the gain selected is two (2), shifted one bit toward the most significant bit when the gain selected is four (4), and not shifted when the gain selected is eight (8).

2. The apparatus according to claim 1, wherein a plurality of bit position shifted digital representations are stored in registers comprising the number of bits of the digital representation plus the number of bits corresponding to the gain selections of the amplifier.

3. The apparatus according to claim 1, wherein a gain is selected for a next sample based upon:
    a slope determined by subtracting a digital representation of a previous sample amplitude from a digital representation of a current sample amplitude, and
    a relationship of the digital representation of the current sample amplitude compared to a plurality of amplitude thresholds, wherein
    for a positive slope and the digital representation is greater than at least one of the plurality of the amplitude thresholds the gain is decreased, and
    for a negative slope and the digital representation is less than at least one other of the plurality of the amplitude thresholds the gain is increased.

4. The apparatus according to claim 3, wherein the at least one and the at least one other of the plurality of the amplitude thresholds are the same.

5. The apparatus according to claim 3, wherein the at least one and the at least one other of the plurality of the amplitude thresholds are different.

6. The apparatus according to claim 3, wherein the digital representation of the previous sample is a plurality of digital representations of previous samples averaged together.

7. The apparatus according to claim 3, wherein the digital representation of the current sample is a plurality of digital representations of current samples averaged together.

8. The apparatus according to claim 1, wherein the selectable gain amplifier is a programmable gain amplifier (PGA).

9. The apparatus according to claim 1, wherein the selectable gain amplifier is an amplifier having at least on switchable input attenuator.

10. The apparatus according to claim 1, wherein the selectable gain amplifier, ADC and digital controller are provided in a mixed signal integrated circuit.

11. The apparatus according to claim 10, wherein the mixed signal integrated circuit is a microcontroller.

12. A method for analog-to-digital conversion at high resolution, said method comprising the steps of:
    amplifying an analog signal with a selectable gain amplifier;
    converting samples of an analog output of the selectable gain amplifier into digital representations thereof with an analog-to-digital converter (ADC) coupled to the selectable gain amplifier;
    selecting gains of the amplifier based upon the digital representations with a controller coupled to the ADC and the selectable gain amplifier;
    shifting bit positions of the digital representations based upon the selected gains; and
    storing the digital representations in a memory.

13. The method according to claim 12, wherein the memory is a plurality of storage registers.

14. The method according to claim 13, wherein the storage registers comprise the number of bits of the digital representations plus the number of bits of the shifted bit positions.

15. The method according to claim 12, further comprising the steps of:
    subtracting a digital representation of a previous sample from a digital representation of a current sample to determine a slope, wherein
    if a subtraction difference is positive then the slope is positive, and
    if the subtraction difference is negative then the slope is negative;
    comparing the digital representation of the current sample to a plurality of amplitude thresholds;
    decreasing the gain for a positive slope when the digital representation is greater than at least one of the plurality of the amplitude thresholds, and
    increasing the gain for a negative slope when the digital representation is less than at least one other of the plurality of the amplitude thresholds.

16. The method according to claim 12, further comprising the step of averaging a plurality of digital representations for selecting the gains of the amplifier.

17. The method according to claim 12, further comprising the steps of:
    subtracting an average of a plurality of digital representations of previous samples from a digital representation of an average of a plurality of current samples to determine a slope, wherein
    if a subtraction difference is positive then the slope is positive, and
    if the subtraction difference is negative then the slope is negative;
    comparing the average of the plurality of digital representations of the current samples to a plurality of amplitude thresholds;

decreasing the gain for a positive slope when the average of the plurality of digital representations is greater than at least one of the plurality of the amplitude thresholds, and increasing the gain for a negative slope when the average of the plurality of digital representations is less than at least one other of the plurality of the amplitude thresholds.

18. A microcontroller according to claim 12.

* * * * *